United States Patent
Tseng et al.

(10) Patent No.: US 8,837,637 B2
(45) Date of Patent: Sep. 16, 2014

(54) METHOD FOR DYNAMICALLY ADJUSTING ONE OR MORE RF PARAMETERS AND COMMUNICATIONS APPARATUS UTILIZING THE SAME

(75) Inventors: Ting-Che Tseng, Hsinchu (TW); Yuan Chen, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 161 days.

(21) Appl. No.: 13/197,960

(22) Filed: Aug. 4, 2011

(65) Prior Publication Data
US 2012/0033762 A1     Feb. 9, 2012

Related U.S. Application Data

(60) Provisional application No. 61/371,847, filed on Aug. 9, 2010.

(51) Int. Cl.
*H04L 27/00*   (2006.01)
*H03G 3/30*    (2006.01)
*H04L 27/22*   (2006.01)

(52) U.S. Cl.
CPC .......... *H04L 27/0008* (2013.01); *H03G 3/3078* (2013.01); *H04L 27/22* (2013.01)
USPC ......................................... 375/316; 375/345

(58) Field of Classification Search
USPC ........................... 375/316, 345–346, 326, 339
See application file for complete search history.

(56) References Cited

U.S. PATENT DOCUMENTS

| | | | |
|---|---|---|---|
| 5,483,244 A * | 1/1996 | Grube et al. .................. 342/463 |
| 5,909,645 A * | 6/1999 | Abramsky et al. ......... 455/249.1 |
| 6,404,757 B1 * | 6/2002 | Ohshima ....................... 370/342 |
| 7,209,529 B2 * | 4/2007 | Iancu et al. .................... 375/346 |
| 8,195,105 B1 * | 6/2012 | Erickson .................... 455/115.1 |
| 2002/0144285 A1 * | 10/2002 | Ovadia .......................... 725/111 |
| 2002/0144286 A1 * | 10/2002 | Ovadia .......................... 725/111 |
| 2004/0042541 A1 * | 3/2004 | Matsumura .................... 375/219 |
| 2005/0025078 A1 * | 2/2005 | Hwang .......................... 370/310 |
| 2005/0114141 A1 * | 5/2005 | Grody ............................ 704/270 |
| 2006/0193375 A1 * | 8/2006 | Lee ................................ 375/219 |
| 2007/0035381 A1 * | 2/2007 | Davis ........................... 340/10.1 |
| 2007/0236571 A1 * | 10/2007 | Lee ................................ 348/192 |
| 2008/0051129 A1 * | 2/2008 | Abe et al. ................... 455/550.1 |
| 2008/0165715 A1 * | 7/2008 | Liu ................................ 370/311 |
| 2008/0181337 A1 * | 7/2008 | Maxim ......................... 375/340 |
| 2008/0200140 A1 * | 8/2008 | Kumura .................... 455/234.1 |
| 2008/0273637 A1 * | 11/2008 | Kuo et al. ..................... 375/345 |
| 2009/0310649 A1 * | 12/2009 | Fisher et al. .................. 375/141 |
| 2010/0027595 A1 * | 2/2010 | Takada et al. ................. 375/219 |
| 2010/0067626 A1 * | 3/2010 | Sankabathula et al. ....... 375/345 |
| 2010/0120434 A1 * | 5/2010 | Hasegawa ..................... 455/436 |
| 2010/0183061 A1 * | 7/2010 | Imahashi et al. ............. 375/222 |
| 2010/0309831 A1 * | 12/2010 | Yeh et al. ...................... 370/311 |
| 2011/0053543 A1 * | 3/2011 | Schultz et al. ............. 455/245.1 |

(Continued)

*Primary Examiner* — Emmanuel Bayard
(74) *Attorney, Agent, or Firm* — McClure, Qualey & Rodack, LLP

(57) ABSTRACT

A communications apparatus is provided. A radio frequency (RF) circuit is arranged to receive an RF signal from an antenna and process the RF signal according to one or more RF parameters to generate an intermediate signal. A signal processing unit is arranged to process the intermediate signal to generate a processed signal and generates signal processing information regarding requirements for processing the intermediate signal. An RF circuit controller is coupled to the RF circuit and the signal processing unit and arranged to dynamically adjust the RF parameters according to the signal processing information.

10 Claims, 14 Drawing Sheets

(56) References Cited

U.S. PATENT DOCUMENTS

2011/0158202 A1* 6/2011 Ozukturk et al. ............ 370/335
2011/0316062 A1* 12/2011 Kondo et al. ................. 257/312
2012/0218979 A1* 8/2012 Yeh et al. ...................... 370/338
2012/0243645 A1* 9/2012 Bougard ........................ 375/343

* cited by examiner

METHOD FOR DYNAMICALLY ADJUSTING ONE OR MORE RF PARAMETERS AND COMMUNICATIONS APPARATUS UTILIZING THE SAME

CROSS REFERENCE TO RELATED APPLICATIONS

This application claims the benefit of U.S. Provisional Application No. 61/371,847 filed Aug. 9, 2010 and entitled "MULTI-RADIO COEXISTENCE OPTIMIZATION". The entire contents of which are hereby incorporated by reference.

BACKGROUND OF THE INVENTION

1. Field of the Invention

The invention relates to an architecture and methods for dynamically adjusting the RF parameters adopted in an RF circuit for processing RF signals, and more particularly to an architecture and methods for dynamically adjusting RF parameters according to the signal to noise ratio (SNR) requirements required for processing the RF signals.

2. Description of the Related Art

With the development of wireless communications technology, mobile electronic devices may be provided with more than one wireless communications service, such as a Bluetooth, Wireless Fidelity (WiFi), Worldwide Interoperability for Microwave Access (WiMAX) wireless communications service, and so on. In this regard, the overlapping or adjacent operating frequency bands among the different wireless communications services causes transmission performances thereof to degrade. Table 1 below shows the operating frequency bands for a WiMAX, WiFi and Bluetooth wireless communications service.

TABLE 1

| Category of Wireless Communications Services | | |
|---|---|---|
| Usage | Wireless Communications service | Frequency band |
| Wide Area Network (WAN) | WiMAX | 2.300-2.400 GHz |
| | | 2.496-2.690 GHz |
| | | 3.300-3.800 GHz |
| Local Area Network (LAN) | WiFi | 2.412-2.4835 GHz |
| | | 4.9-5.9 GHz |
| Personal Area Network (PAN) | Bluetooth | 2.402-2.480 GHz |

As shown in Table 1, the frequency bands of WiFi and Bluetooth overlap with each other. In addition, the frequency bands of WiFi and Bluetooth are adjacent to the frequency bands of the WiMAX. When these wireless communications modules are integrated in a mobile electronic devices, simultaneous transmissions and receptions by different wireless communications modules cause transmission interference and make the setting of RF parameters (such as gain setting) critical. For example, FIG. 1 shows an exemplary received signal power at around the 2.4 GHz band. Because the interference signal is stronger (i.e. the signal power is higher) than the wanted signal, the electronic components (such as the MOS transistors) in the radio frequency (RF) circuit may more easily be saturated due to the amplified interference signal when a higher gain is applied on the received signal. Therefore, an architecture and method for dynamically adjusting the RF parameters adopted in the RF circuit for processing the RF signals are highly required.

BRIEF SUMMARY OF THE INVENTION

Communications apparatuses and methods for dynamically adjusting one or more radio frequency (RF) parameters are provided. With proper parameters, the receiving performance such as anti-interference ability and error rate can be improved. An embodiment of a communication apparatus comprises an RF circuit, a signal processing unit and an RF circuit controller. The RF circuit is arranged to receive an RF signal from an antenna and process the RF signal according to one or more RF parameters to generate an intermediate signal. The signal processing unit is arranged to process the intermediate signal to generate a processed signal and generate signal processing information regarding requirements for processing the intermediate signal. The RF circuit controller is coupled to the RF circuit and the signal processing unit and arranged to dynamically adjust the RF parameters according to the signal processing information An embodiment of a method for dynamically adjusting one or more RF parameters adopted in an RF circuit of a communications apparatus for processing an RF signal, comprises receiving the RF signal and processing the RF signal according to the RF parameters to generate an intermediate signal processing the intermediate signal and obtaining signal processing information regarding requirements for processing the intermediate signal; and dynamically adjusting the RF parameters according to the signal processing information.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

Table 1 shows an exemplary AGC lookup table for modulation/demodulation type 1 according to an embodiment of the invention; and Table 2 shows an exemplary AGC lookup table for modulation/demodulation type 2 according to an embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
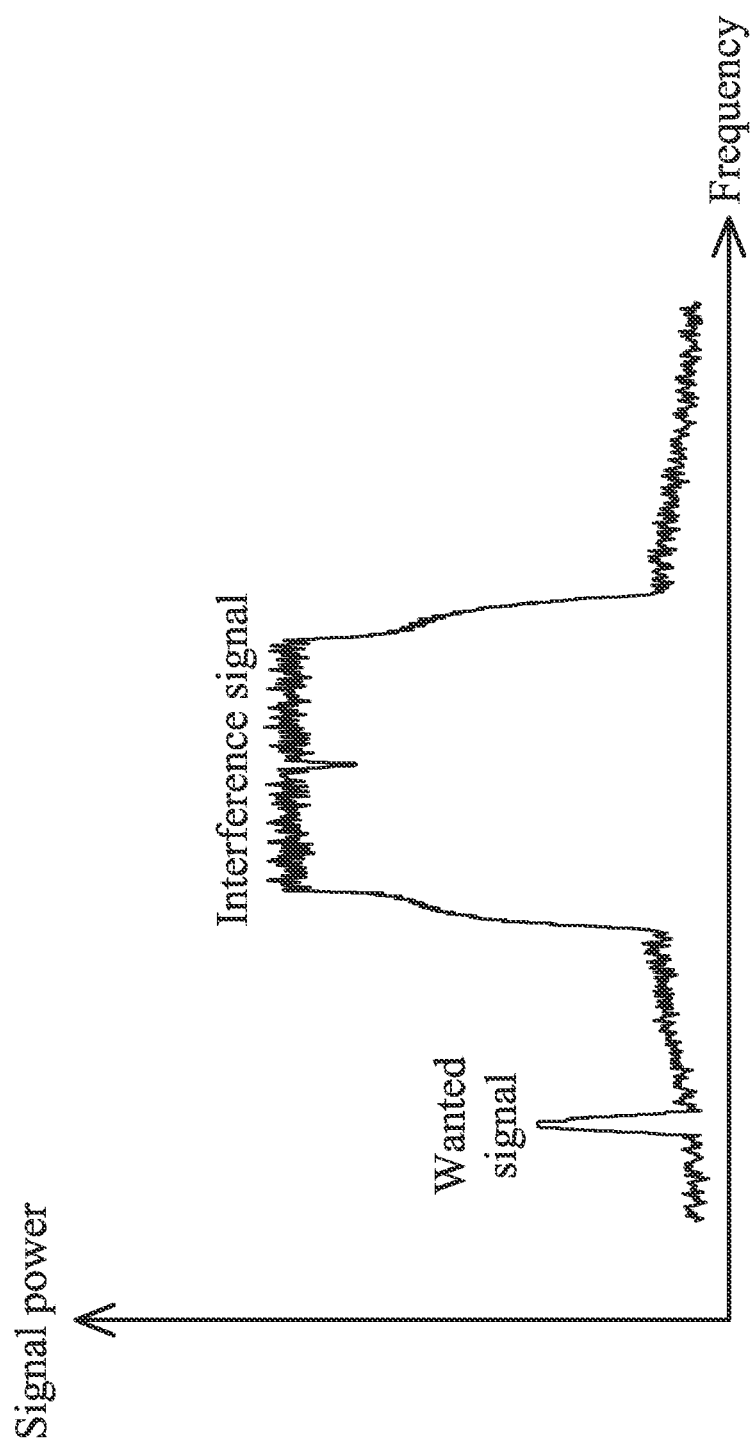
FIG. 1 shows an exemplary received signal power at around the 2.4 GHz band.
Figure 2:
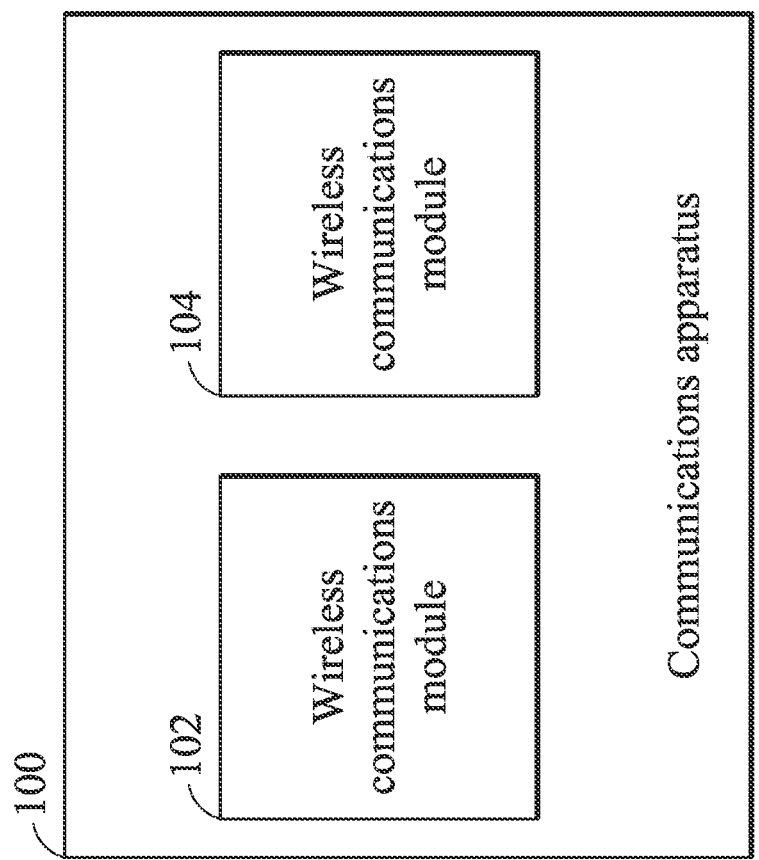
FIG. 2 shows a communications apparatus according to an embodiment of the invention.

FIG. 2 shows a communications apparatus according to an embodiment of the invention. The communications apparatus 100 may be a notebook, a cellular phone, a portable gaming device, a portable multimedia player, a navigation apparatus, a receiver, or others. The communications apparatus 100 may comprise a plurality of wireless communications modules (for example, wireless communications modules 102 and 104) providing different wireless communications services. As an example, the wireless communications module may be a WiFi radio module, a Wimax radio module, a Bluetooth radio module, or others. The WiFi radio module may communicate with a WiFi device in compliance with the IEEE 802.11 protocol via the air interface. The Wimax radio module may communicate with a Wimax device in compliance with the IEEE 802.16 protocol via the air interface. The Bluetooth radio module may communicate with a Bluetooth device in compliance with the IEEE 802.15.1 protocol via the air interface. Note also that each wireless communications module may be implemented as a single chip for providing the corresponding wireless communication services, or may be integrated into a combo chip (i.e., a system on chip (SoC)), and the invention should not be limited thereto.

As previously described, when multiple wireless communications modules are integrated in a communications apparatus, simultaneous transmission and reception by different wireless communications modules cause transmission interference, and further cause the radio frequency (RF) circuit in the wireless communications module(s) to be saturated more easily. Therefore, an architecture and method for dynamically adjusting the RF parameters adopted in the RF circuit for processing the RF signals are proposed.

Figure 3:
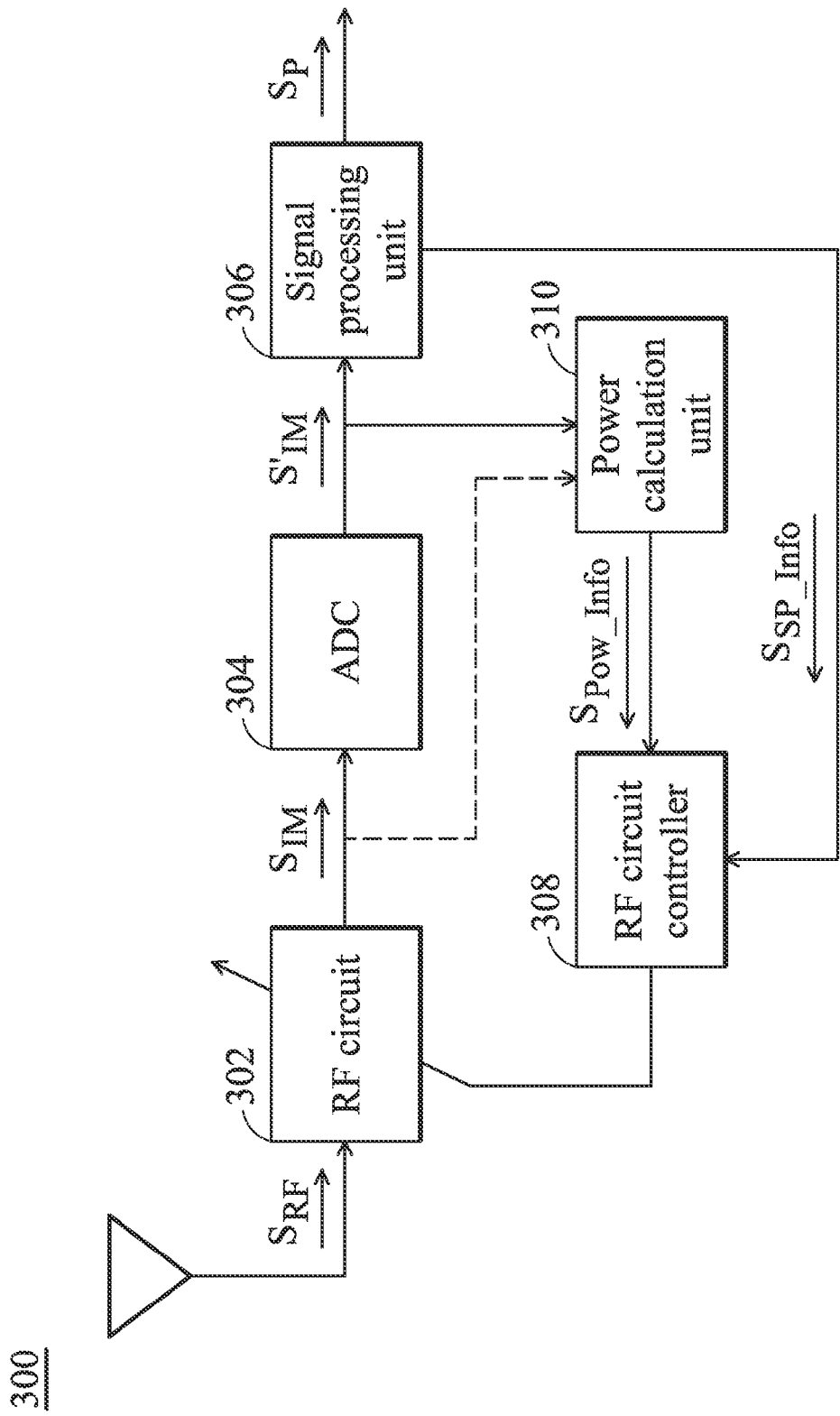
FIG. 3 is a block diagram showing an exemplary wireless communications module according to an embodiment of the invention.

FIG. 3 is a block diagram showing an exemplary wireless communications module according to an embodiment of the invention. For brevity, FIG. 3 presents a simplified block diagram, in which some elements required in a complete receiver are omitted. However, note that the invention should not be limited to what is shown in the FIG. 3. According to an embodiment of the invention, the wireless communications module 300 may comprise an RF circuit 302, an analog to digital converter (ADC) 304, a signal processing unit 306, an RF circuit controller 308 and a power calculation unit 310.

The RF circuit 302 is arranged to receive an RF signal $S_{RF}$ from an antenna and process the RF signal $S_{RF}$ according to one or more RF parameters to generate an intermediate signal $S_{IM}$. According to an embodiment of the invention, the RF circuit 302 may amplify and down convert the RF signal $S_{RF}$ to an intermediate frequency (IF) signal or directly to a baseband signal as the intermediate signal $S_{IM}$. The ADC 304 is arranged to convert the intermediate signal $S_{IM}$ from an analog domain to a digital domain to generate the digitalized intermediate signal $S'_{IM}$. The signal processing unit 306 is arranged to process the digitalized intermediate signal $S'_{IM}$ to generate a processed signal $S_P$. The processed signal $S_P$ may be the decoded and demodulated result of the digitalized intermediate signal $S'_{IM}$, and may be provided to a following stage (not shown) for further processing.

According to an embodiment of the invention, the signal processing unit 306 is further arranged to generate signal processing information $S_{SP\_Info}$ regarding the requirements for processing the intermediate signal (which will be discussed in more detail in the following paragraphs). The power calculation unit 310 is arranged to calculate signal power of the intermediate signal $S_{IM}$ (or the digitalized intermediate signal $S'_{IM}$, depending on whether the calculation is performed in analog or digital domain) and thereby generate signal power information $S_{Pow\_Info}$. The RF circuit controller 308 is coupled to the RF circuit 302 and is arranged to dynamically adjust the RF parameters, which are adopted by the RF circuit 302 to process the RF signal $S_{RF}$, according to the signal processing information $S_{SP\_Info}$ and the signal power information $S_{Pow\_Info}$ (which will be discussed in more detail in the following paragraphs).

Figure 4:
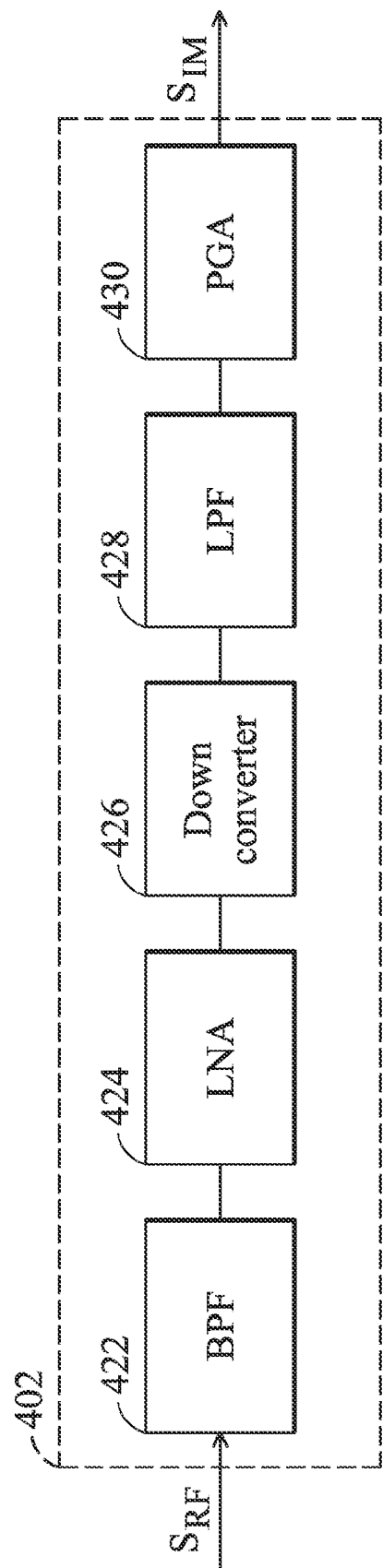
FIG. 4 is a block diagram showing an exemplary RF circuit according to an embodiment of the invention.

FIG. 4 is a block diagram showing an exemplary RF circuit according to an embodiment of the invention. The RF circuit 402 may comprise a bandpass filter (BPF) 422, a low noise amplifier (LNA) 424, a down converter 426, a low pass filter (LPF) 428 and a programmable gain amplifier (PGA) 430. The BPF 422 may be regarded as a channel select filter to filter out unwanted signals and leave the RF signal in the desired frequency band (for example, the desired frequency band around 2.4 GHz).

The LNA 424 is arranged to amplify very weak signals (for example, the RF signal $S_{RF}$ captured by the antenna) received from the BPF 422 according to a first gain value. The down converter 426 may comprise one or more mixers to perform frequency down conversion on the RF signal $S_{RF}$. The LPF 428 is arranged to filter out the unwanted interference in the down converted signal and leave the desired signal in the desired frequency band (for example, the IF signal or baseband signal). The PGA 430 is arranged to amplify the signal received from the LPF 428 according to a second gain value.

Figure 5:
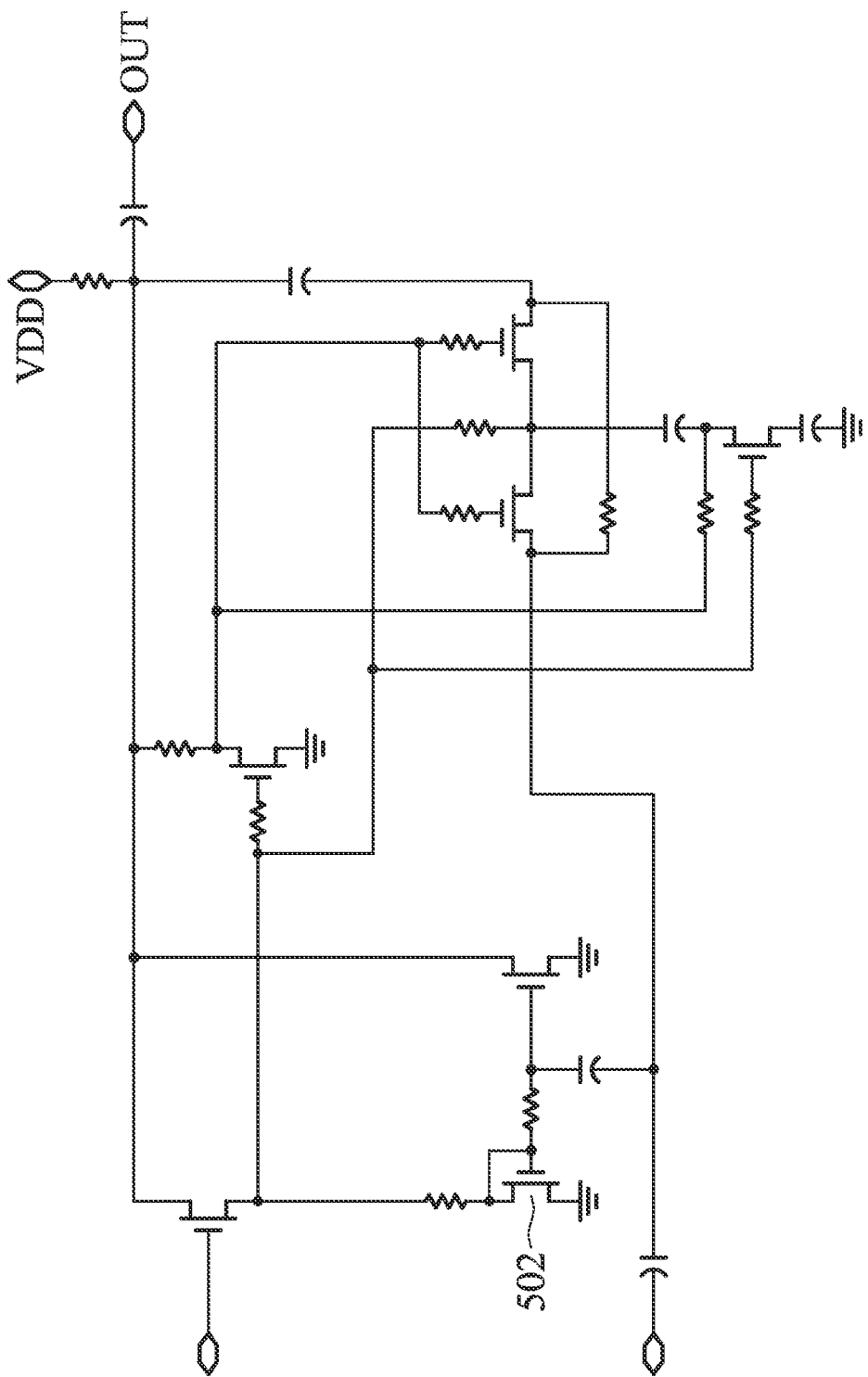
FIG. 5 shows an exemplary circuit diagram of a low noise amplifier according to an embodiment of the invention.

According to an embodiment of the invention, the RF circuit controller 308 may dynamically adjusts a current or a bias voltage in the RF circuit, a filter bandwidth, or a gain value adopted by the amplifier (such as the first gain value for the LNA 424 or the second gain value for the PGA 430 as shown in FIG. 4) in the RF circuit. FIG. 5 shows an exemplary circuit diagram of a low noise amplifier according to an embodiment of the invention. In the embodiment, the bias voltage (for example, the voltage VDD), the current of the current mirror transistor 502, or any other voltage or current utilized in the LNA circuit or in any other electronic device of the RF circuit may be one of the adjustable RF parameters in the invention. Note that the LNA circuit shown in FIG. 5 is only an example for illustrating the concept of the invention. A person of ordinary skill in the art will readily appreciate that the LNA or any other devices (such as the BPF, LPF, PGA and down converter) in the RF circuit may be implemented in various ways, and therefore, the invention should not be limited to what is shown in FIG. 5.

Figure 6:
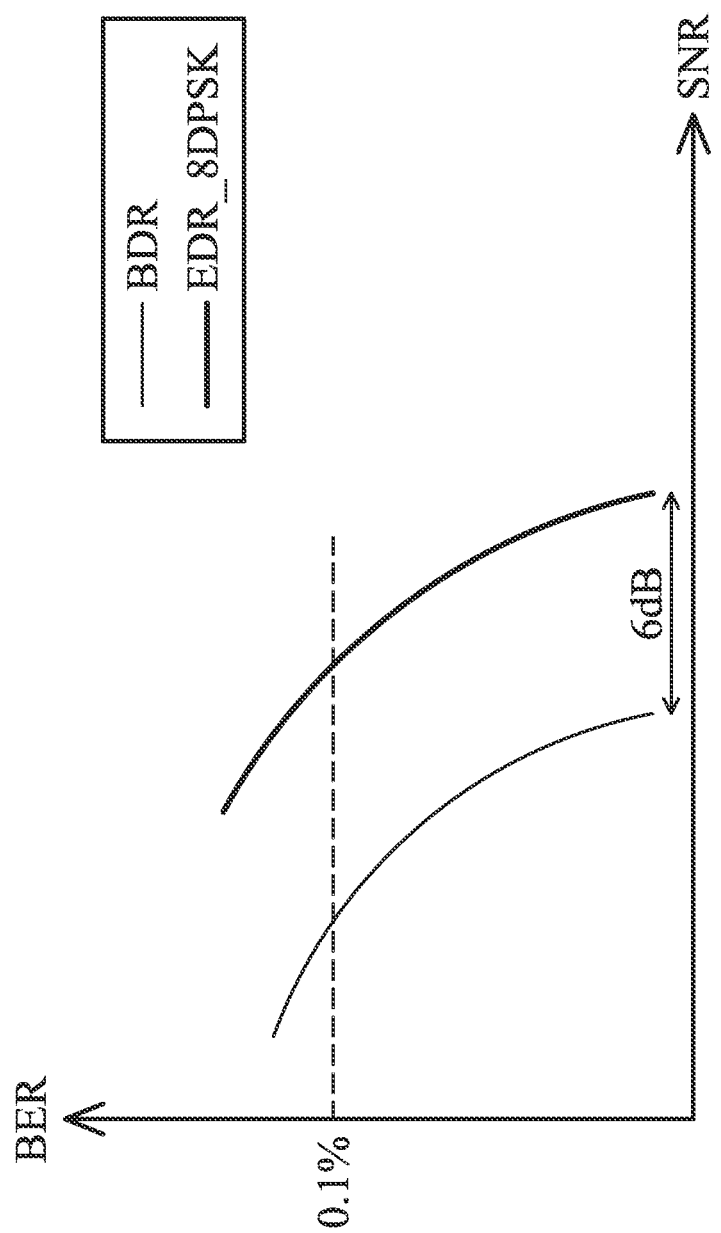
FIG. 6 is a schematic diagram showing the SNR versus BER curves according to an embodiment of the invention.

According to an embodiment of the invention, the signal processing information $S_{SP\_Info}$ provided by the signal processing unit 306 may comprise a signal to noise ratio (SNR) requirement required for processing the intermediate signal. The SNR requirements may be defined in the corresponding specifications. For example, the Bluetooth technology may support three kinds of data rates, including the basic data rate (BDR), enhanced data rate (EDR) and EDR_8DPSK. The BDR payload data may be modulated by the Gaussian-shape Frequency Shift Keying (GFSK) scheme. The EDR payload data may be modulated by the 8 Differential Phase Shift Keying (8DPSK) or π/4 Differential Quadrature Phase-Shift Keying (π/4 DQPSK) scheme. The EDR_8DPSK payload data may be modulated by the 8PSK scheme. Note that because the Bluetooth data may be modulated by different schemes (i.e. different types), the SNR requirements of the BDR, EDR and EDR_8DPSK data may be different. FIG. 6 is a schematic diagram showing the SNR versus BER (bit error rate) curves according to an embodiment of the invention. Generally, an upper limit of a tolerable BER may be specified by the corresponding standards, and the required SNR to at least satisfy the upper limit may be obtained from the SNR versus BER curves as shown in FIG. 6. Note that as shown in FIG. 6, the BDR data and EDR 8DPSK data have a 6 dB difference for a required SNR to achieve the same BER.

Generally, the RF signal $S_{RF}$ (and therefore, as well as the intermediate signal $S_{IM}$ and digitalized intermediate signal $S'_{IM}$) is composed of a plurality of packets, and the signal processing unit 306 may receive and process the plurality of packets in sequence. Because the SNR requirement is related to the modulation/demodulation type for modulating/demodulating the data carried in the received signal $S_{RF}$ as previously described, in a preferable embodiment, the signal processing unit 306 may carry information regarding the modulation/demodulation type for modulating/demodulating a segment of data in a currently processed packet or the modulation/demodulation type for modulating/demodulating data in an incoming packet in the signal processing information $S_{SP\_Info}$.

Figure 7:
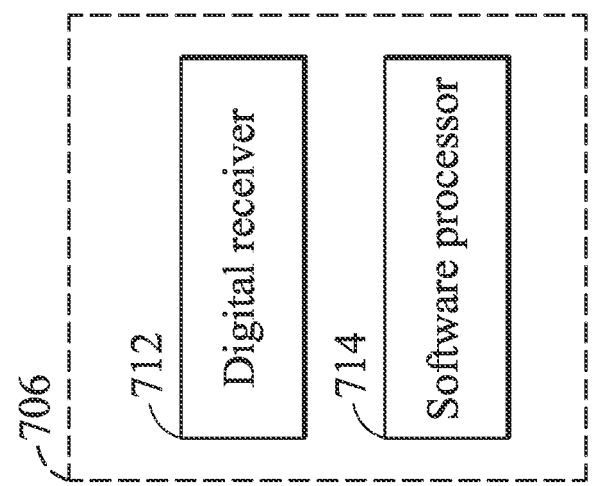
FIG. 7 is a block diagram showing an exemplary signal processing unit according to an embodiment of the invention.
Figure 8:
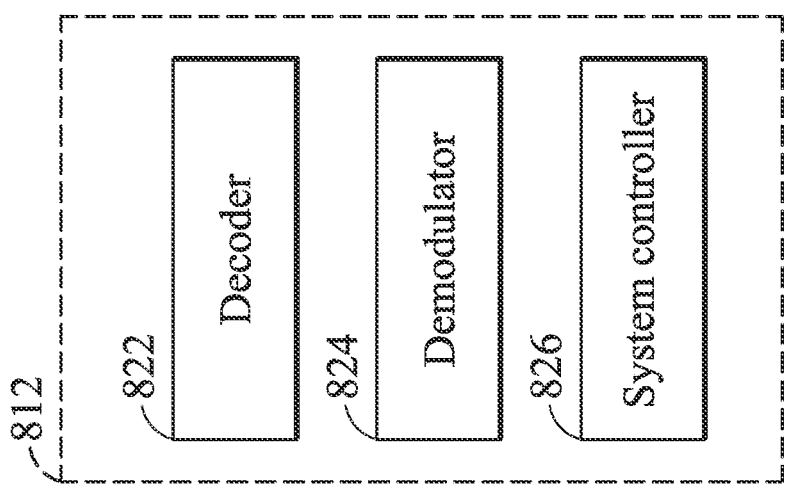
FIG. 8 is a block diagram showing an exemplary digital receiver according to an embodiment of the invention.

FIG. 7 is a block diagram showing an exemplary signal processing unit according to an embodiment of the invention. In the embodiment, the signal processing unit 706 at least comprises a digital receiver 712 and a software processor 714. The digital receiver 712 may comprise a plurality of hardware modules to receive and process the digitalized intermediate signal $S'_{IM}$ in a physical layer, and the software processor 714 is substantially a software module for processing the digitalized intermediate signal $S'_{IM}$ in the layers above the physical layer (for example, the MAC layer, the link layer, or above). FIG. 8 is a block diagram showing an exemplary digital receiver according to an embodiment of the invention. The digital receiver 812 may comprise a decoder 822, a demodulator 824 and a system controller 826. The decoder 822 is arranged to decode the digitalized intermediate signal $S'_{IM}$. The demodulator 824 is arranged to demodulate the digitalized intermediate signal $S'_{IM}$. The system controller 826 is arranged to control the operations of the digital receiver 812 (for example, maintaining a state machine to control the state change when processing the digitalized intermediate signal $S'_{IM}$). Note that FIG. 7 and FIG. 8 present simplified block diagrams, in which only the elements relevant to the invention are shown, in order to clarify the concept of the invention. However, the invention should not be limited to what is shown on the FIG. 7 and FIG. 8.

Figure 9:
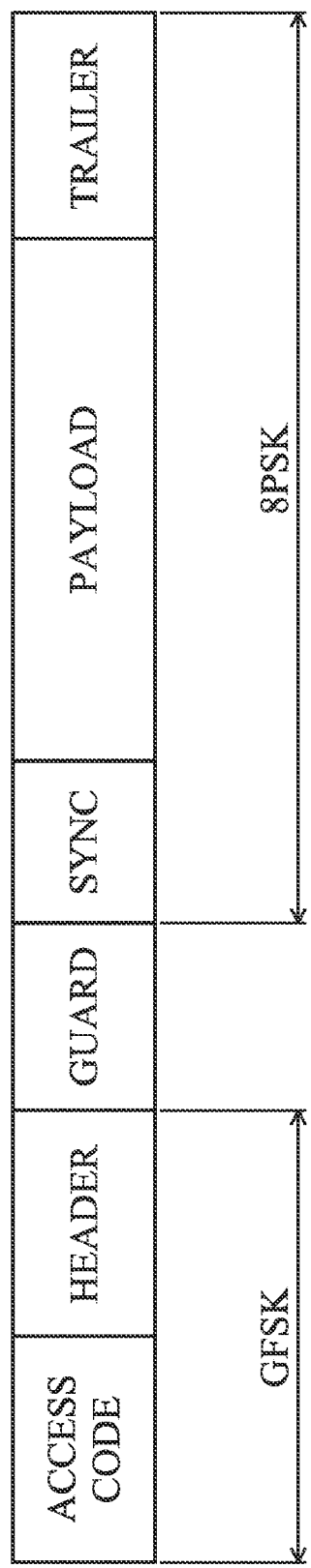
FIG. 9 shows the Bluetooth EDR_8DPSK packet format according to an embodiment of the invention.

According to an embodiment of the invention, the digital receiver 712/812 may be arranged to provide the information regarding the SNR requirement and/or the modulation/demodulation type for modulating/demodulating a segment of data in a currently processed packet, and the software processor 714 may be arranged to provide the information regarding the SNR requirement and/or the modulation/demodulation type for modulating/demodulating data in an incoming packet. FIG. 9 shows the Bluetooth EDR_8DPSK packet format according to an embodiment of the invention. The access code and packet header are transmitted using the GFSK modulation scheme, whereas the subsequent synchronization sequence, payload and trailer subsequence are transmitted using the 8PSK modulation scheme. Generally, the packet type is described in the header field, and the digital receiver 712/812 may provide the information regarding the SNR requirement and/or the modulation type for modulating the subsequent payload data after decoding the header. Because different segments of data within a packet may be modulated by different schemes as shown in FIG. 9, the RF circuit controller 308 may dynamically adjust the RF parameters according to the SNR requirement and/or the modulation/demodulation type for modulating/demodulating the subsequent payload data carried in the signal processing information $S_{SP\_Info}$, so that the RF circuit 302 may adopt different RF parameters to process one packet (i.e. a same packet). Note that in the preferred embodiments, the RF circuit controller 308 may adjust the RF parameters during the guard interval as shown (i.e. intra-packet adjustment).

On the other hand, because the software processor 714 is arranged to process the digitalized intermediate signal $S'_{IM}$ in the upper layers, the software processor 714 may obtain the information regarding a following communications status of the wireless communications module, for example, whether a Synchronous Connection Oriented (SCO) link or an Asynchronous Connectionless Link (ACL) is going to be established, or which application is going to be executed, or others. Therefore, the software processor 714 may be arranged to provide the information regarding the SNR requirement and/or the modulation/demodulation type for modulating/demodulating in an incoming packet. For example, the SNR requirements and/or modulation/demodulation type applied in the SCO packets or ACL packets may be different. Once the software processor 714 obtains the information regarding whether an SCO link or an ACL link is going to be established according to the messages transmitted between the communications apparatus 100 and a peer communications apparatus, the software processor 714 may provide the information regarding the SNR requirement and/or the modulation/demodulation type for modulating/demodulating the incoming packets as the signal processing information $S_{SP\_Info}$ to the RF circuit controller 308. The RF circuit controller 308 may dynamically adjust the RF parameters according to the SNR requirements and/or the modulation/demodulation type for modulating/demodulating data in the incoming packet carried in the signal processing information $S_{SP\_Info}$, so that the RF circuit 302 may adopt different RF parameters to process different packets (i.e. inter-packet adjustment).

Figure 10A:
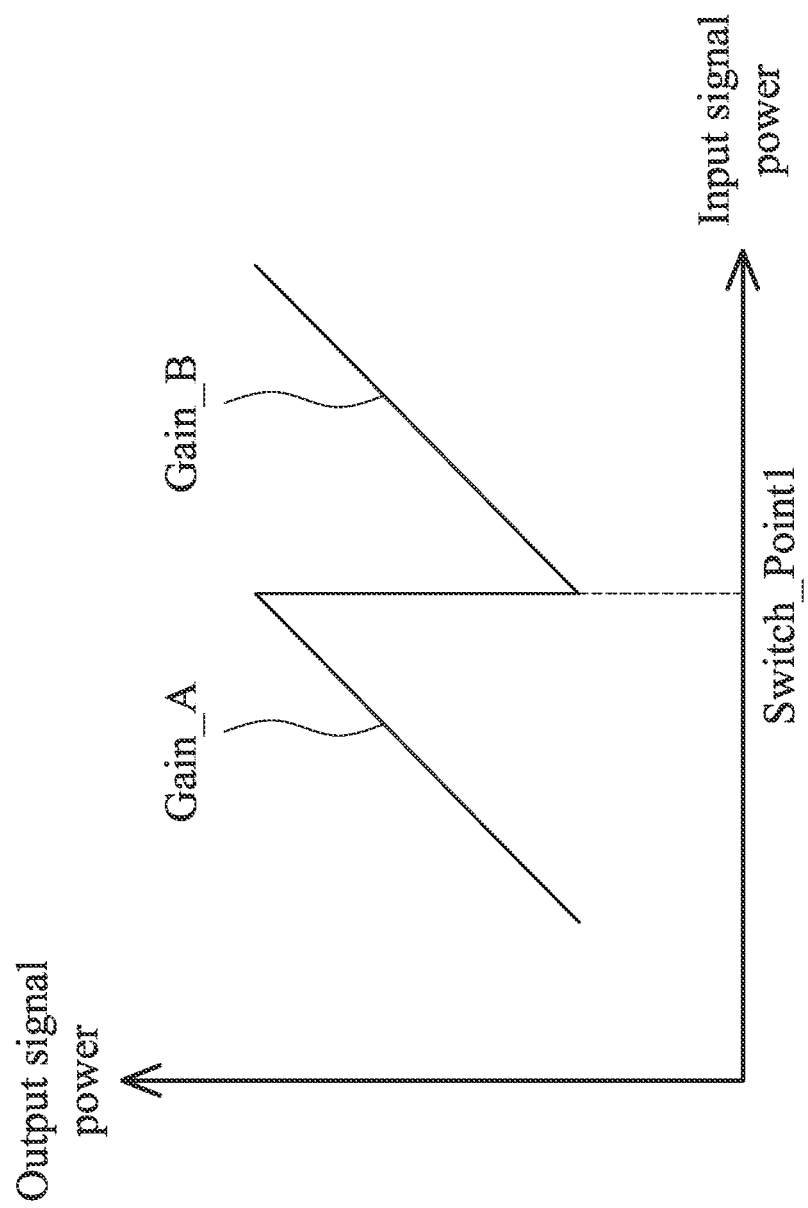
FIG. 10a is a diagram showing a first automatic gain control (AGC) configuration configured for processing the 8PSK modulated data according to an embodiment of the invention.
Figure 10B:
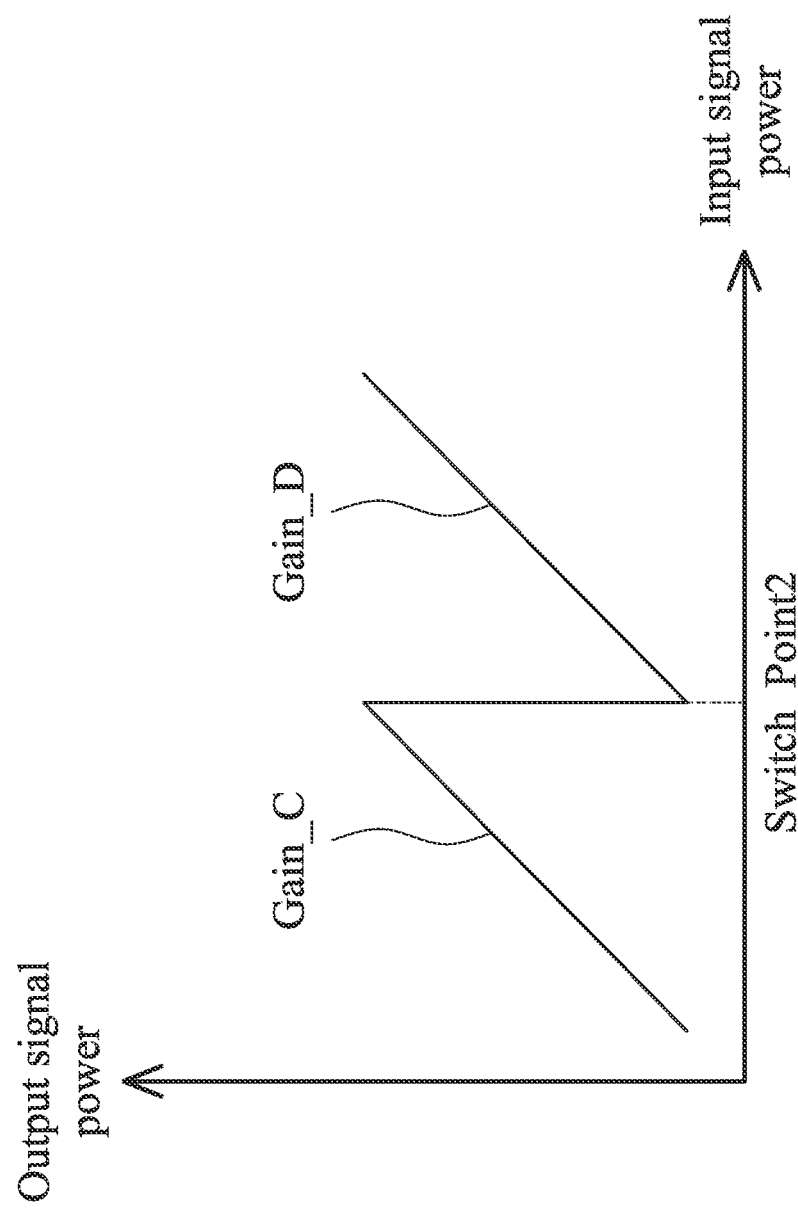
FIG. 10b is a diagram showing a second AGC configuration configured for processing the GFSK modulated data according to another embodiment of the invention.

In the following paragraphs, several embodiments of adjusting the RF parameters will be illustrated. Note that the gain setting adopted by the amplifier (such as the LNA 424 or the PGA 430 as shown in FIG. 4) in the RF circuit are utilized in the following embodiments as an adjustable RF parameter, but the invention should not be limited thereto. FIG. 10a is a diagram showing a first automatic gain control (AGC) configuration configured for processing the 8PSK modulated data according to an embodiment of the invention. FIG. 10b is a diagram showing a second AGC configuration configured for processing the GFSK modulated data according to another embodiment of the invention. In FIG. 10a and FIG. 10b, the X axis represents the input signal power and the Y axis represents the output signal power of the amplifier in the RF circuit (such as the LNA 424 or the PGA 430 as shown in FIG. 4). As shown in FIG. 10a, in order to tolerate more interference and keep enough SNR for signal processing, once the input signal power reaches the first switch point Switch_Point1, the applied gain value is switched from Gain_A to Gain_B. Similarly, as shown in shown in FIG. 10b, once the input signal power reaches the second switch point Switch_Point2, the applied gain value is switched from Gain_C to Gain_D. Note that Gain_A could be the same with or different from Gain_C Gain_B could be the same with or different from Gain_D. Note that because the SNR requirements required for processing the BDR and EDR_8DPSK data are different (as shown in FIG. 6), the positions of switch points Switch_Point1 and Switch_Point2 may be different. In this example, the input signal power at the switch point Switch_Point1 for a high SNR requirement data (i.e. the 8PSK modulated data) is higher than that of the switch point Switch_Point2 for a low SNR requirement data (i.e. the GFSK data).

According to an embodiment of the invention, because it is preferable that the data modulated in different schemes have different AGC configurations (as shown in FIG. 10a and FIG. 10b), several lookup tables may be predefined according to the AGC configurations and stored in the RF circuit controller 308. Table 1 and Table 2 show the exemplary AGC lookup tables predefined for modulation/demodulation type 1 and 2 according to an embodiment of the invention.

TABLE 1

The AGC lookup tables predefined for modulation/demodulation type 1
Modulation/Demodulation type 1

| Signal power $P_I$ | Applied gain value |
|---|---|
| $P_I$ < TH11 | G11 |
| TH11 <= $P_I$ < TH12 | G12 |
| TH12 <= $P_I$ | G13 |

TABLE 2

The AGC lookup tables predefined for modulation/demodulation type 2
Modulation/Demodulation type 2

| Signal power $P_I$ | Applied gain value |
|---|---|
| $P_I$ < TH21 | G21 |
| TH21 <= $P_I$ < TH22 | G22 |
| TH22 <= $P_I$ | G23 |

Because the RF circuit controller 308 receives the signal processing information $S_{SP\_Info}$ from the signal processing unit 306 and the signal power information $S_{Pow\_Info}$ from the power calculation unit 310, the RF circuit controller 308 may obtain a proper gain value from the lookup tables according to the modulation/demodulation type carried in the signal processing information $S_{SP\_Info}$ and the signal power carried in the signal power information $S_{Pow\_Info}$, and dynamically adjust the gain value applied in the RF circuit 302. For example, when the signal power increases, the gain value is preferably adjusted to decrease. For another example, suppose that the adjustable RF parameter is the current in the RF circuit 302, when the signal power increases, the current is preferably adjusted to decrease.

Note that in conventional design, the RF parameters are fixed and cannot be adjusted. However, in the invention, the RF parameters can be dynamically adjusted, either in an inter-packet or intra-packet manner, according to the signal power, SNR requirements, and/or modulation/demodulation schemes. Because the RF parameters can be dynamically adjusted for different SNR requirements and/or modulation/demodulation schemes, the anti-interference capability of the wireless communications module can be increased. For example, referring to FIG. 9, FIG. 10a and FIG. 10b, when the AGC configuration adopted by the RF circuit controller 308 is changed from the one shown in FIG. 10b to the one shown in FIG. 10a because the RF circuit controller 308 knows that the modulation/demodulation type is changed from GFSK to 8PSK (for example, a Bluetooth EDR packet is received), the switch point may be changed from Switch_Point2 to Switch_Point1. The AGC configuration is optimized for different modulation types, and therefore, anti-interference capability of the wireless communications module increases (especially for low-rate modulation).

Figure 11:
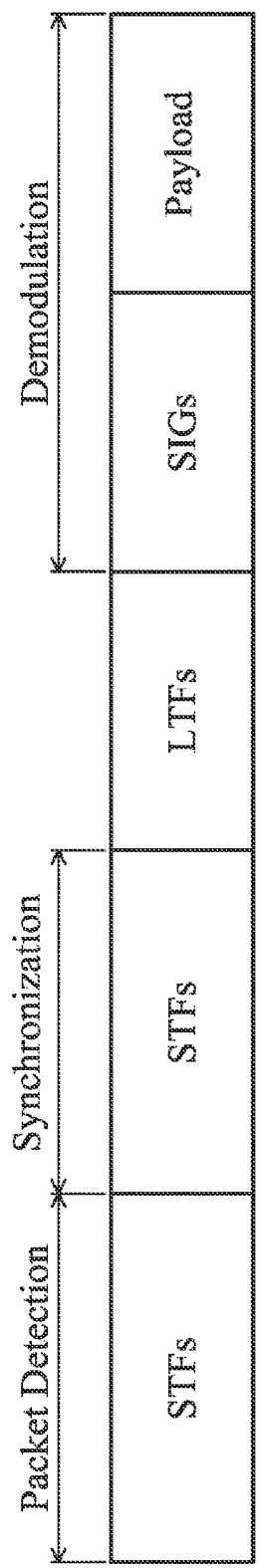
FIG. 11 shows a WiFi packet format according to an embodiment of the invention.

According to another embodiment of the invention, in addition to the modulation/demodulation type, the SNR requirements may also be different when the signal processing types for the signal processing unit 306 to process the digitalized intermediate signal $S'_{IM}$ are different. According to yet another embodiment of the invention, the SNR requirements may also be different when the decoding and/or demodulating capability for the signal processing unit 306 to process the digitalized intermediate signal $S'_{IM}$ are different. FIG. 11 shows a WiFi packet format according to an embodiment of the invention. The signal processing unit 306 uses the first segment of short training fields (STFs) data to perform packet detection, the second segment of STFs data to perform synchronization, and the signal filed (SIGs) and payload data to perform demodulation. Therefore, the signal processing types (or purpose) for processing data in different segments may be different. The SNR requirement for demodulation may be higher than for packet detection because higher accuracy is required for demodulation. Therefore, according to another embodiment of the invention, the signal processing information $S_{SP\_Info}$ may also comprise the signal processing type or the processing (for example, decoding and/or demodulating) capability for the signal processing unit 306 to process the digitalized intermediate signal $S'_{IM}$.

In some embodiment of the invention, the system controller 826 is arranged to carry the information regarding the signal processing type in the signal processing information $S_{SP\_Info}$. As previously described, the system controller 826 may maintain a state machine to control the state change when processing the digitalized intermediate signal $S'_{IM}$. Therefore, the system controller 826 may obtain the information regarding a next state to be changed while processing the digitalized intermediate signal $S'_{IM}$. For example, when performing packet detection on the WiFi packet, the system controller 826 may be aware that a next step (state) is to perform synchronization, and the signal processing unit 306 may carry the information in the signal processing information $S_{SP\_Info}$. As a result, the RF circuit controller 308 may adjust the RF parameters as previously described, so that the RF parameters are adopted for performing the current packet detection and a following synchronization may be different. Similarly, the RF parameters adopted for performing synchronization and demodulation may also be different.

Figure 12:
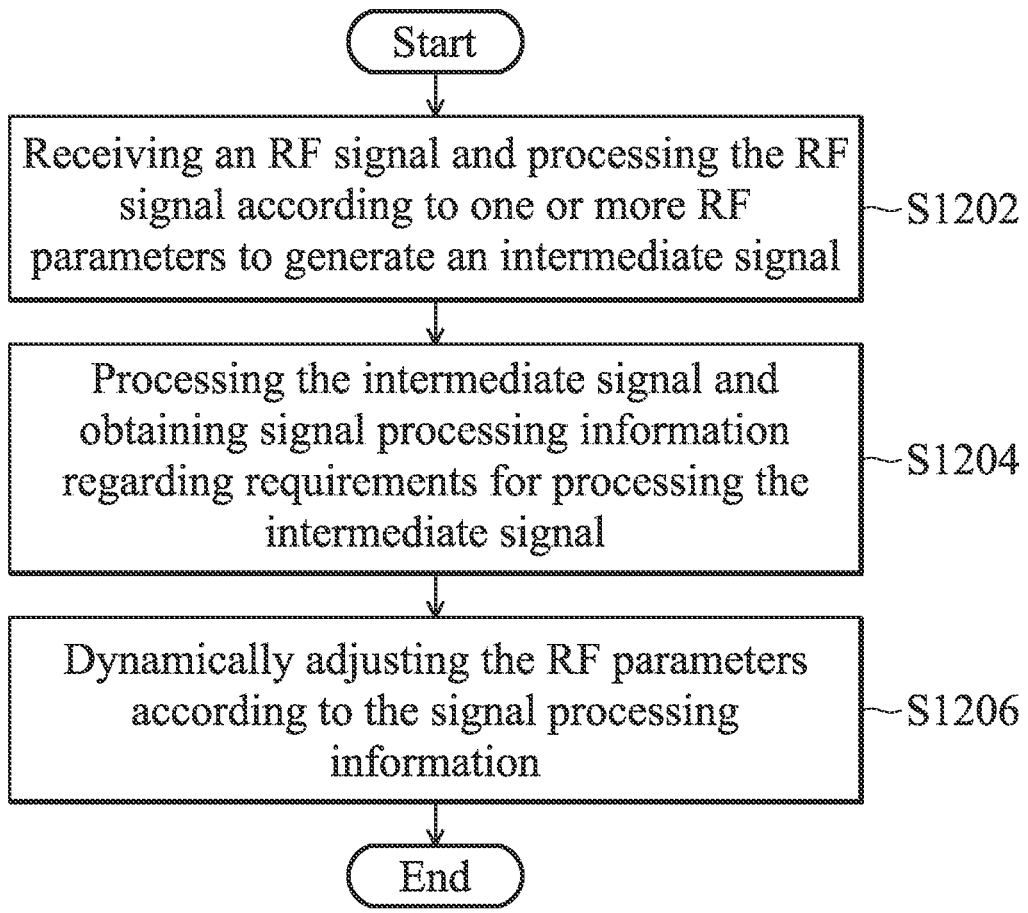
FIG. 12 shows a flow chart of a method for dynamically adjusting the RF parameters according to an embodiment of the invention.

FIG. 12 shows a flow chart of a method for dynamically adjusting the RF parameters according to an embodiment of the invention. The wireless communications module in the communications apparatus first receives an RF signal and processes the RF signal according to one or more RF parameters to generate an intermediate signal (Step S1202). Next, the wireless communications module processes the intermediate signal and obtains signal processing information regarding requirements for processing the intermediate signal (Step S1204). Finally, the wireless communications module dynamically adjusts the RF parameters according to the signal processing information (Step S1206). As previously described, the signal processing information may be the SNR requirement, the modulation/demodulation type, the signal processing type and/or signal processing capability required for processing an incoming data segment in a currently processed packet or an incoming packet of the intermediate signal.

Figure 13:
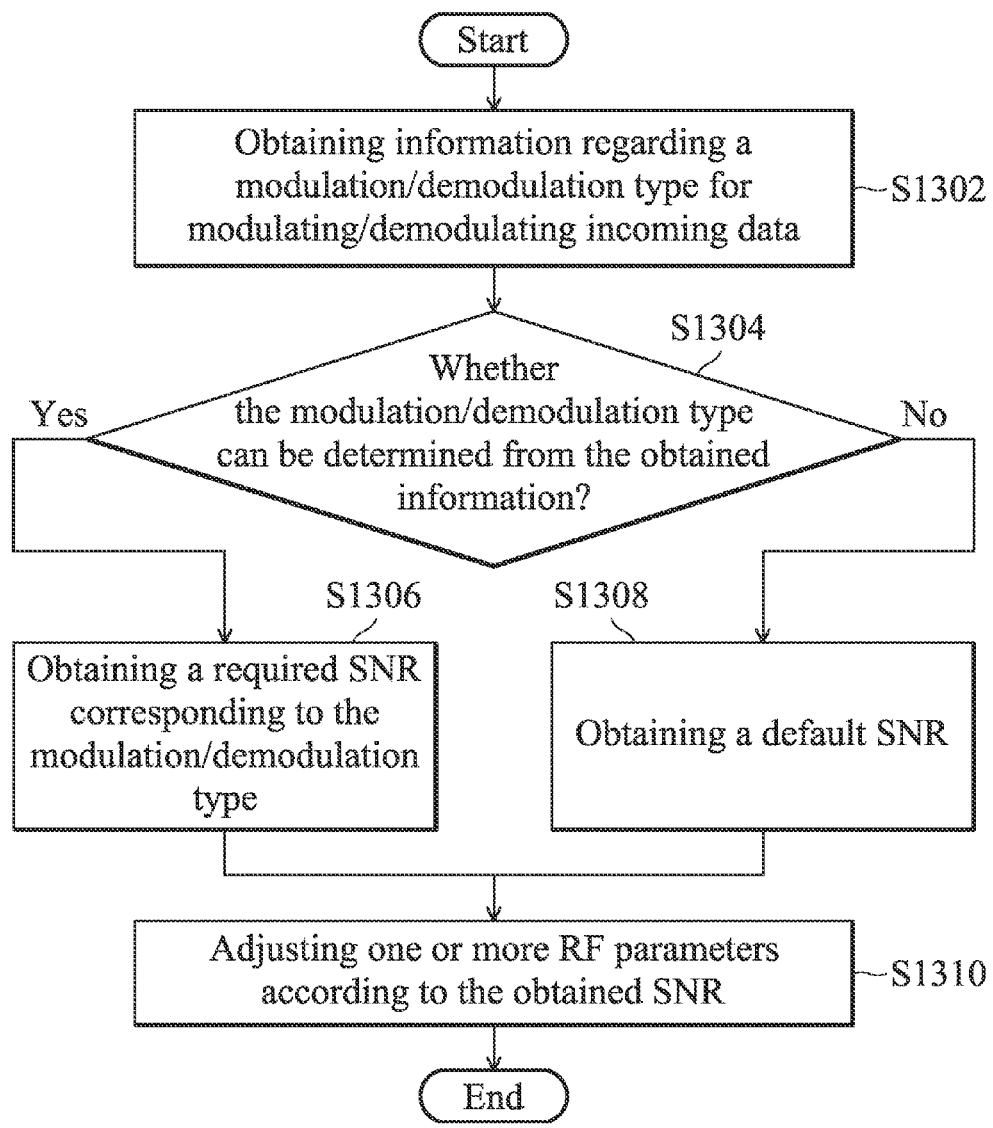
FIG. 13 shows a flow chart of a method for dynamically adjusting the RF parameters according to another embodiment of the invention.

FIG. 13 shows a flow chart of a method for dynamically adjusting the RF parameters according to another embodiment of the invention. In the embodiment, the signal processing information is the modulation/demodulation type for modulating/demodulating the incoming data segment in a currently processed packet or an incoming packet. Firstly, the wireless communications module obtains information regarding a modulation/demodulation type for modulating/demodulating incoming data (Step S1302). Next, the wireless communications module determines whether the modulation/demodulation type can be determined from the obtained information (Step S1304). When the modulation/demodulation type can be determined from the obtained information, the wireless communications module obtains a required SNR corresponding to the modulation/demodulation type (Step S1306). When the modulation/demodulation type can not be determined from the obtained information, the wireless communications module obtains a default SNR (Step S1308), which may be the SNR requirement for a weakest modulation/demodulation type. Finally, the wireless communications module adjusts one or more RF parameters according to the obtained SNR (Step S1310).

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A communications apparatus, comprising:
 a radio frequency (RF) circuit, arranged to receive an RF signal from an antenna and process the RF signal according to one or more RF parameters to generate an intermediate signal;
 a signal processing unit, arranged to process the intermediate signal to generate a processed signal and generate signal processing information regarding requirements for processing the intermediate signal; and
 an RF circuit controller, coupled to the RF circuit and the signal processing unit and arranged to dynamically adjust the RF parameters according to the signal processing information,
 wherein the intermediate signal is composed of a plurality of packets, and the signal processing information further comprises a modulation/demodulation type for modulating/demodulating a segment of data of a currently processed packet, and
 wherein the RF parameters are adjusted based on the modulation/demodulation type.

2. The communications apparatus as claimed in claim 1, wherein the RF parameters comprise a current in the RF circuit.

3. The communications apparatus as claimed in claim 1, wherein the RF parameters comprise a bias voltage in the RF circuit.

4. The communications apparatus as claimed in claim 1, wherein the RF circuit comprises at least an amplifier for amplifying the RF signal and the RF parameters comprise a gain value adopted by the amplifier for amplifying the RF signal.

5. The communications apparatus as claimed in claim 1, wherein the signal processing information further comprises a signal to noise ratio (SNR) requirement required for processing the intermediate signal.

6. The communications apparatus as claimed in claim 1, wherein the signal processing information further comprises a modulation/demodulation type for modulating/demodulating data of an incoming packet.

7. The communications apparatus as claimed in claim 1, wherein the signal processing information further comprises a signal processing type for the signal processing unit to process the intermediate signal.

8. The communications apparatus as claimed in claim 1, wherein the RF circuit adopts different RF parameters to process one packet.

9. The communications apparatus as claimed in claim 1, wherein the RF circuit adopts different RF parameters to process different packets.

10. The communications apparatus as claimed in claim 1, further comprising:
 a power calculation unit, coupled to the signal processing unit and the RF circuit controller and arranged to calculate signal power of the intermediate signal to generate signal power information,
 wherein the RF circuit controller dynamically adjusts the RF parameters further according to the signal power information.

* * * * *